(12) United States Patent
Zhang

(10) Patent No.: US 6,618,296 B2
(45) Date of Patent: Sep. 9, 2003

(54) CHARGE PUMP WITH CONTROLLED CHARGE CURRENT

(75) Inventor: Haoran Zhang, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/201,189

(22) Filed: Jul. 22, 2002

(65) Prior Publication Data

US 2003/0038669 A1 Feb. 27, 2003

Related U.S. Application Data

(63) Continuation-in-part of application No. 09/934,931, filed on Aug. 22, 2001, now Pat. No. 6,445,623, and a continuation-in-part of application No. 10/101,050, filed on Mar. 18, 2002.
(60) Provisional application No. 60/365,905, filed on Mar. 20, 2002.

(51) Int. Cl.⁷ ................................................ G11C 7/00
(52) U.S. Cl. .................................. 365/189.09; 365/149
(58) Field of Search ....................... 365/189.09, 189.11, 365/149; 363/60, 63; 307/110

(56) References Cited

U.S. PATENT DOCUMENTS

| | | | |
|---|---|---|---|
| 4,999,761 A | * | 3/1991 | Bingham et al. ............. 363/60 |
| 5,717,581 A | | 2/1998 | Canclini |
| 5,973,944 A | | 10/1999 | Nork |

OTHER PUBLICATIONS

Linear Technology Corporation, LTC1515 Series, "Step–Up/Step–Down Switched Capacitor DC/DC Converters with Reset," Technical Data Sheet, pp1–8.
Maxim Integrated Products, MAX679, "Regulated 3.3V Charge Pump," Apr. 1997, Technical Data Sheet, pp1–6.
Erich Bayer and Hans Schmeller, "Tomorrows Charge Pumps —Today, " Apr.–Jun. 2000, European Technology, TI Technical Journal, Technical Paper, pp1–8.
Robert St. Pierre, Gain Technology Corporation, "Low–Power BiCMOS Op Amp with Integrated Current Mode Charge Pump," Technical Paper, pp1–4.
Maxim Integrated Products MAX1747, "Triple Charge–Pump TFT LCD DC–DC Converter," Oct. 2000, Technical Data Sheet, pp1–13.
Linear Technology, "Doubler Charge Pumps with Low Noise Linear Regulator," Technical Data Sheet, pp1–12.
Texas Instruments, "50mA Switched–Cap Dc/Dc Converter," Feb. 2001, Technical Data, pp1–8.
Texas Instruments, "TPS6010x/TPS6011x Charge Pump," May 22, 2001, Application Report Abstract http://www.ti-.com/sc/docs/psheets/abstract/apps/slva070a.htm.
MAXIM, "Properties of the Charge–Pump Voltage Splitter," May 22, 2001, Technical Data, pp1–6 http://dbserv.maxim–ic.com/tarticle/view.

* cited by examiner

Primary Examiner—Vu A. Le
(74) Attorney, Agent, or Firm—W. Daniel Swayze, Jr.; W. James Brady; Frederick J. Telecky, Jr.

(57) ABSTRACT

A charge pump circuit is configured for suitably controlling the charging current in the charge pump capacitors. The charge pump circuit comprises an input current controlling circuit comprising a current limiting device for controlling the inrush current, and thus the charging current in the charge pump capacitors. The input current controlling circuit is configured to regulate the average voltage at the output of the current limiting device to correspond to the average voltage at the output of a pass device configured for regulating the output current. Accordingly, the total input current, and thus the charging current in the charge pump capacitors, can be suitably controlled at all times to significantly reduce the impact of any instantaneous charging currents.

25 Claims, 3 Drawing Sheets

CHARGE PUMP WITH CONTROLLED CHARGE CURRENT

CROSS-REFERENCE TO RELATED APPLICATIONS

This is a continuation-in-part application that claims priority of U.S. application Ser. No. 09/934,931, filed Aug. 22, 2001, now U.S. Pat. No. 6,445,623 entitled "CHARGE PUMPS WITH CURRENT SOURCES FOR REGULATION, and U.S. application Ser. No. 10/101,050, filed Mar. 18, 2002, entitled "CHARGE PUMP HAVING VERY LOW VOLTAGE RIPPLE", both applications being hereby incorporated by reference herein. In addition, this application claims priority of U.S. Provisional Application No. 60/365,905, filed Mar. 20, 2002, entitled "CHARGE PUMP WITH CONTROLLED CHARGE CURRENT.

FIELD OF INVENTION

The present invention relates to charge pumps for use in integrated circuits. More particularly, the present invention relates to a charge pump having a circuit for controlling the charging current of the charge pump.

BACKGROUND OF THE INVENTION

The demand for less expensive, and yet more reliable integrated circuit components for use in communication, imaging and high-quality video applications continues to increase rapidly. As a result, integrated circuit manufacturers are requiring improved performance in the voltage supplies and references for such components and devices to meet the design requirements of such emerging applications.

One device utilized for providing a regulated voltage supply is a charge pump circuit. Charge pumps are DC/DC converters that utilize a capacitor instead of an inductor or transformer for energy storage, and are configured for generating positive or negative voltages from the input voltage. Charge pumps can be configured in various manners, including a charge pump voltage doubler circuit, i.e., a charge pump circuit configured for doubling the input voltage, as well as tripler and inverter configurations. These charge pumps can operate to multiply the input voltage by some factor, such as by one-half, two, or three times or any other suitable factor of the input voltage, to generate the desired output voltage. In addition, charge pump circuits can be configured for single phase regulation, with a single charge pump capacitor used to charge current during one phase of operation and discharge current during another phase of operation, or for dual phase regulation, in which two charge pump capacitors are configured to operate during both phases of operation, i.e., one of the capacitors is charging current and the other capacitor is discharging current during each phase of operation.

Charge pumps typically utilize transistors and/or diodes as switching devices to provide current paths for charge transfer. On occasions when the sum of any residual voltages of the charging capacitors in a charging/discharging circuit loop is smaller than the voltage of the power supply, a significantly large amount of transient current tends to flow within the loop. Further, an uncontrolled peak current occurring during charging or discharging of the capacitors is only limited by the "on-resistance" of the switching devices and the equivalent series resistance (ESR) of the capacitors. Moreover, the uncontrolled alternating peak current generally flows out of the positive power supply and into the negative power supply, e.g., into ground, thus causing significantly large electromagnetic interference (EMI) to associated electronic circuits. Still further, the large uncontrolled current also tends to charge the output reservoir capacitor which results in large voltage ripples at the output of the charge pump.

With reference to FIG. 1, a charge pump regulator circuit 100 configured for dual phase voltage regulation is illustrated. Charge pump regulator circuit 100 includes a charge pump control circuit 102 comprising four switches $S_1$, $S_2$, $S_3$ and $S_4$ and a first pump capacitor $C_{PUMP}$ configured for supplying current to a load device during a first phase, and four switches $S_1'$, $S_2'$, $S_3'$ and $S_4'$ and a second pump capacitor $C_{PUMP'}$ configured for supplying current to a load device during a second phase. In addition, charge pump circuit 100 comprises a reservoir capacitor $C_{RES}$ for maintaining charge to a load device $R_{LOAD}$ to facilitate regulation of output voltage $V_{OUT}$. A pass device $M_1$ is coupled between a supply voltage $V_{IN}$ and switches $S_1$ and $S_1'$ for regulating output voltage $V_{OUT}$ by controlling the output current, e.g., by controlling the discharging current of first pump capacitor $C_{PUMP}$ and second pump capacitor $C_{PUMP'}$. For example, for a discharging current of 5 mA alternating from each of first pump capacitor $C_{PUMP}$ and second pump capacitor $C_{PUMP'}$, an average total output current of 5 mA can be realized. As a result of the dual phase regulation, output voltage $V_{OUT}$ can be configured to be approximately twice the voltage at a node A, i.e., the voltage at the drain of pass device $M_1$. However, the charging currents of first pump capacitor $C_{PUMP}$ and second pump capacitor $C_{PUMP'}$ are determined only by the difference between a supply voltage $V_{IN}$ and the residual voltage of capacitors $C_{PUMP}$ and $C_{PUMP'}$, the on-resistance of switches $S_2$ and $S_3$ and switches $S_2'$ and $S_3'$, and the ESR of capacitors $C_{PUMP}$ and $C_{PUMP'}$.

Charge pump circuit 100 is typically controlled by a clock having a 50% duty cycle, i.e., a clock having a clock phase-one and phase-two. During clock phase-one, switches $S_1$ and $S_4$ are closed to allow current to flow through pass device $M_1$, switch $S_1$, a pre-charged capacitor $C_{PUMP}$, and switch $S_4$ to load device $R_{LOAD}$, while switches $S_2$ and $S_3$ remain in an "off" condition. Meanwhile, switches $S_2'$ and $S_3'$ are closed to allow charging current to flow through switches $S_2'$ and $S_3'$ such that pump capacitor $C_{PUMP'}$ is pre-charged to approximately the supply voltage $V_{IN}$, while switches $S_1'$ and $S_4'$ remain in an "off" condition, i.e., opened. During clock phase-two, switches $S_1'$ and $S_4'$ are closed to allow current to flow through pass device $M_1$, switch $S_1'$, charged capacitor $C_{PUMP'}$, and switch $S_4'$, to load device $R_{LOAD}$, while switches $S_2'$ and $S_3'$ are opened. Meanwhile, switches $S_2$ and $S_3$ are closed to allow re-charging current to flow through switches $S_2$ and $S_3$ such that pump capacitor $C_{PUMP}$ is again pre-charged to approximately the supply voltage $V_{IN}$, while switches $S_1$ and $S_4$ are opened. The above dual phase operation suitably repeats at a fixed frequency controlled by the clock.

The current through pass device $M_1$ for regulation of output voltage $V_{OUT}$, i.e., the output or discharging current, is controlled by adjusting the gate voltage $V_C$ of pass device $M_1$. For example, with reference to FIG. 2, a voltage regulator circuit 200 comprising a charge pump control circuit 202 and an error amplifier 204 can be configured with a negative feedback control loop to provide an output voltage $V_{OUT}$ approximately equal to two times the voltage $V_A$ at node A, i.e., a voltage $2V_A$. Error amplifier 204 is configured to receive a voltage reference $V_{REF}$ and a feedback signal $V_{FB}$ through feedback resistor network comprising resistors $R_1$ and $R_2$. Accordingly, error amplifier 204
} can control gate voltage $V_C$, and thus enabling pass device to facilitate regulation of output voltage $V_{OUT}$ through regulation of the voltage $V_A$ at node A.

However, the recharging or inrush current is only limited by the on-resistance of switches $S_2$ and $S_3$ and switches $S_2'$ and $S_3'$. The selection of the on-resistance for switches $S_2$ and $S_3$ and switches $S_2'$ and $S_3'$ is difficult, in that while switches $S_2$ and $S_3$ and switches $S_2'$ and $S_3'$ generally need to be configured to provide a high enough on-resistance to limit any inrush current, switches $S_2$ and $S_3$ and switches $S_2'$ and $S_3'$ must also be configured to provide a low enough on-resistance to output sufficient current at a low level of supply voltage $V_{IN}$. Due to the concurrent need to provide such a low enough on-resistance, a large inrush of current can occur during the closing of switches $S_2$ and $S_3$ and switches $S_2'$ and $S_3'$, for example up to ten times the average output current, thus resulting in conductive noise within the charge pump circuit 100.

Moreover, as the supply voltage $V_{IN}$ increases from a low level to a high level, the on-resistance of switches S1, S2, S3 and S4 tends to decrease to a very low level due to a higher gate driving voltage. Accordingly, the current flowing through, i.e., the current flowing to ground and to capacitor $C_{RES}$, becomes excessively large, thus resulting in uncontrolled electromagnetic interference (EMI) with other associate electronic devices in the forms of both conduction and radiation.

Still further, due to large transient currents flowing through the wirebond between the silicon and the lead frame, a high slew rate of current change is realized, thus inducing voltage spikes across the wirebonds. Accordingly, these voltage spikes induce errors within any internal precision analog circuitry, thus generating output voltage ripple and noise at the output of the charge pump regulator.

SUMMARY OF THE INVENTION

In accordance with various aspects of the present invention, a charge pump circuit is configured for suitably controlling the charging current in the charge pump capacitors. In accordance with an exemplary embodiment, the charge pump circuit is suitably configured with an input current controlling circuit comprising a current limiting device for controlling the inrush current, and thus the charging current in the charge pump capacitors. The input current controlling circuit is configured to regulate the current flowing through the current limiting device to correspond to the current flowing through a pass device configured for regulating the output current. Accordingly, the total input current, and thus the charging current in the charge pump capacitors, can be suitably controlled at all times to significantly reduce the impact of any instantaneous charging currents.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION

The present invention may be described herein in terms of various functional components. It should be appreciated that such functional components may be realized by any number of hardware or structural devices configured to perform the specified functions. For example, the present invention may employ various integrated components, e.g., buffers, supply references, current mirrors, logic devices and the like, which are comprised of various electrical devices, e.g., resistors, transistors, capacitors, diodes and the like whose values may be suitably configured for various intended purposes. In addition, the present invention may be practiced in any integrated circuit application where regulated voltage supplies are desired. However for purposes of illustration only, exemplary embodiments of the present invention will be described herein in connection with a dual phase charge pump circuit. Further, it should be noted that while various components may be suitably coupled or connected to other components within exemplary circuits, such connections and couplings can be realized either by direct connection between components, or by connection through other components and devices located thereinbetween.

As discussed above, previous approaches for solving the problems of charge pump circuits have difficulty in limiting the inrush current. However, in accordance with various aspects of the present invention, a charge pump circuit is configured for suitably controlling the charging current in the charge pump capacitors. In accordance with an exemplary embodiment, the charge pump circuit is suitably configured with an input current controlling circuit comprising a current limiting device for controlling the inrush current, and thus the charging current in the charge pump capacitors. The input current controlling circuit is configured to regulate the current flowing through the current limiting device to correspond, for example be approximately the same or some larger or smaller percentage, to the current flowing through a pass device configured for regulating the output current. Accordingly, the total input current, and thus the charging current in the charge pump capacitors, can be suitably controlled at all times to significantly reduce the impact of any instantaneous charging currents.

Figure 3:
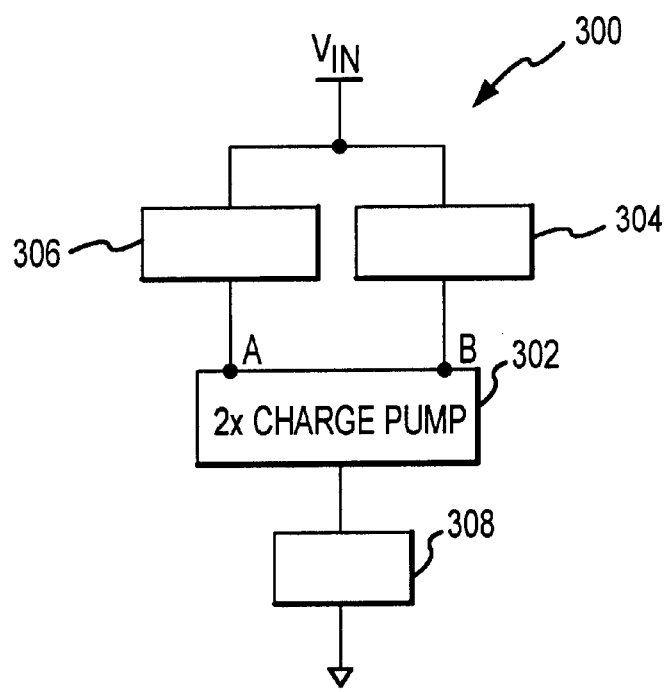
FIG. 3 illustrates a block diagram of an exemplary charge pump circuit in accordance with an exemplary embodiment of the present invention.

For example, with reference to FIG. 3, a charge pump circuit 300 configured for dual phase voltage regulation is illustrated. Charge pump circuit 300 suitably comprises a charge pump control circuit 302, an input current controlling circuit 304, an output current controlling circuit 306 and an output load circuit 308. Charge pump control circuit 302 is configured for facilitating regulation of the output voltage at output load circuit 308. In accordance with an exemplary embodiment, charge pump control circuit 302 comprises a pair of charge pump capacitors configured for dual phase operation. Output current controlling circuit 306 suitably comprises a circuit configured for regulation of the output voltage of charge pump circuit 300 by controlling the voltage at node A. For example, output current controlling circuit 306 can comprise a pass device $M_1$ configured for controlling the current flowing through charge pump control circuit 302 to output load circuit 308 through control of the gate voltage of pass device $M_1$. Output load circuit 308 suitably comprises a reservoir capacitor for maintaining the output voltage on a load device.

Input current controlling circuit 304 is suitably configured for controlling the inrush current, and thus the charging current to charge pump control circuit 302. Input current controlling circuit 304 comprises a current limiting device for limiting the inrush current to charge pump circuit 300. In accordance with an exemplary embodiment, input current controlling circuit 304 is configured to regulate the average voltage at the output of the current limiting device, i.e., the average voltage at a node B, to be approximately or ideally equal to the average voltage at the output of output controlling circuit 306, i.e., the average voltage at node A. In controlling the average voltage at node B, the average current flowing through the current limiting device can be configured substantially equal to the output current, which is also substantially equal to the discharging current through pass device $M_1$. Accordingly, by regulating the voltage at node B, the total input current, and thus the charging current in the charge pump capacitors, can be suitably controlled to significantly reduce the impact of any instantaneous charging currents.

Figure 1:
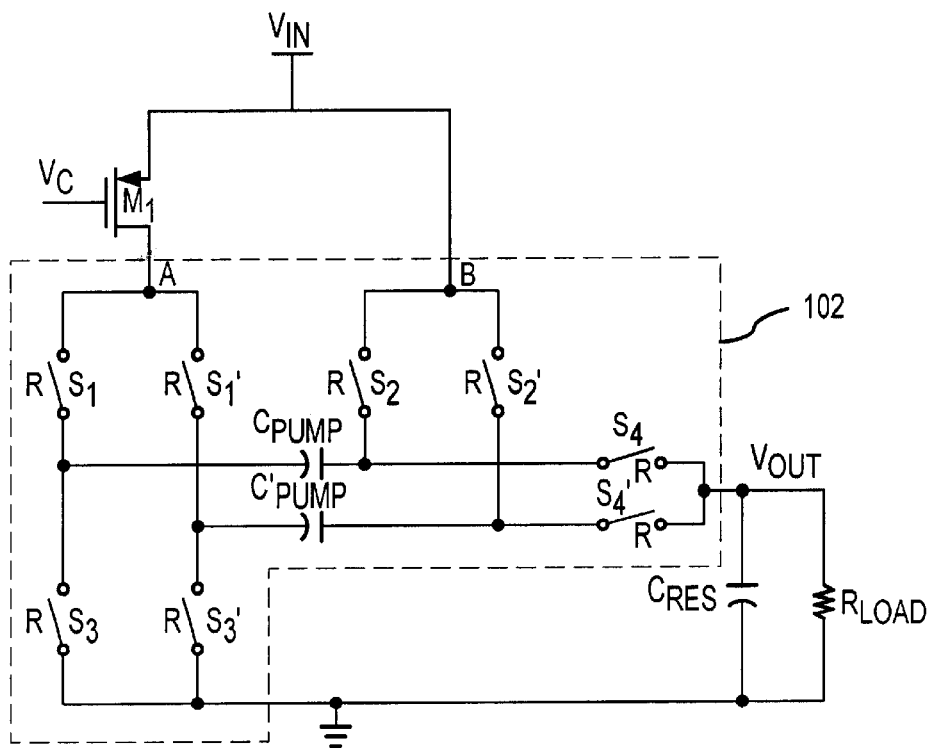
FIG. 1 illustrates a schematic diagram of a prior art charge pump circuit.
Figure 2:
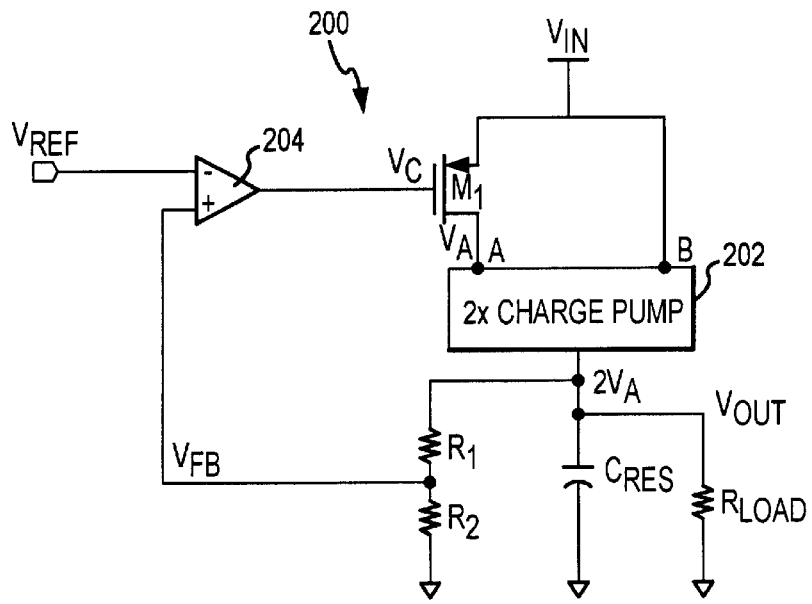
FIG. 2 illustrates a schematic diagram of a prior art voltage regulator circuit.
Figure 4:
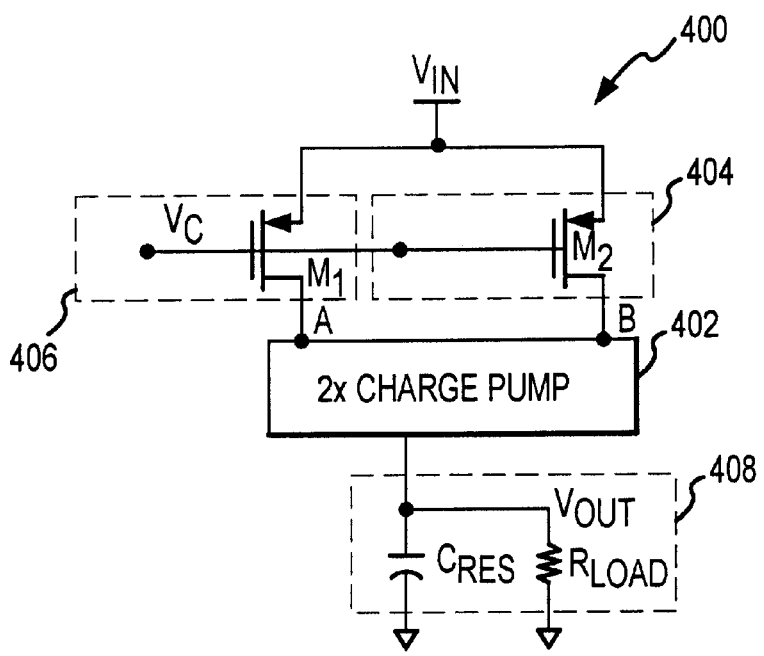
FIG. 4 illustrates a schematic diagram of an exemplary charge pump circuit in accordance with an exemplary embodiment of the present invention.

Input current controlling circuit 304 can be configured in various arrangements for controlling the input current to charge pump circuit 300. For example, in accordance with an exemplary embodiment, with reference to a charge pump circuit 400 illustrated in FIG. 4, an exemplary input current controlling circuit 404 can comprise a current limiting device $M_2$ configured between an input supply voltage $V_{IN}$ and charge pump control circuit 402 to control the inrush current, and thus charging current in the charge pump capacitors of charge pump control circuit 402. An output current controlling circuit 406 comprises a pass device $M_1$ configured for regulating the output voltage. Pass device $M_1$ suitably comprises a PMOS transistor device having a source coupled to input supply voltage $V_{IN}$ and a drain coupled to charge pump control circuit 402 at node A. The current through pass device $M_1$ can be controlled through control or otherwise adjustment of a voltage $V_C$ at the gate of pass device $M_1$, and thus resulting in control of the voltage at node A. Control voltage $V_C$ can be suitably provided from the output of an error amplifier of a voltage regulator circuit, such as that illustrated in FIG. 2.

In accordance with the exemplary embodiment, current limiting device $M_2$ is configured for control of the voltage at node B to suitably limit the inrush current to charge pump circuit 400. In the exemplary embodiment, current limiting device $M_2$ comprises a PMOS transistor having an input terminal, i.e., a source terminal, coupled to input supply voltage $V_{IN}$ and an output terminal, i.e., a drain terminal, coupled to charge pump control circuit 402 at node B; however, current limiting device $M_2$ can also comprise a PNP-type transistor, or any other like device.

For control of current limiting device $M_2$, a control terminal, i.e., a gate terminal, of current limiting device $M_2$ is suitably coupled to the control terminal, i.e., the gate terminal, of pass device $M_1$ to receive control voltage $V_C$. In addition, the transistor sizes of pass device $M_1$ and current limiting device $M_2$ can be configured approximately equal. As a result, the current through current limiting device $M_2$ is approximately equal to the current through pass device $M_1$. Accordingly, input current controlling circuit 404 can regulate the inrush current, and thus the charging current of the charge capacitors of charge pump control circuit 402.

While input current controlling circuit 404 of charge pump circuit 400 can suitably provide for control of the inrush current, input current controlling circuit 404 is more suitably configured for a non-overlapping clock scheme, i.e., a clock scheme in which the two phases of operation for dual phase charge pump circuit 400 do not overlap. In the event that an overlapping clock scheme is utilized, input current controlling circuit 404 can be configured such that current limiting device $M_2$ is suitably scaled in size to that of pass device $M_1$, thus resulting in an appropriate amount of current flowing through current limiting device $M_2$.

Figure 5:
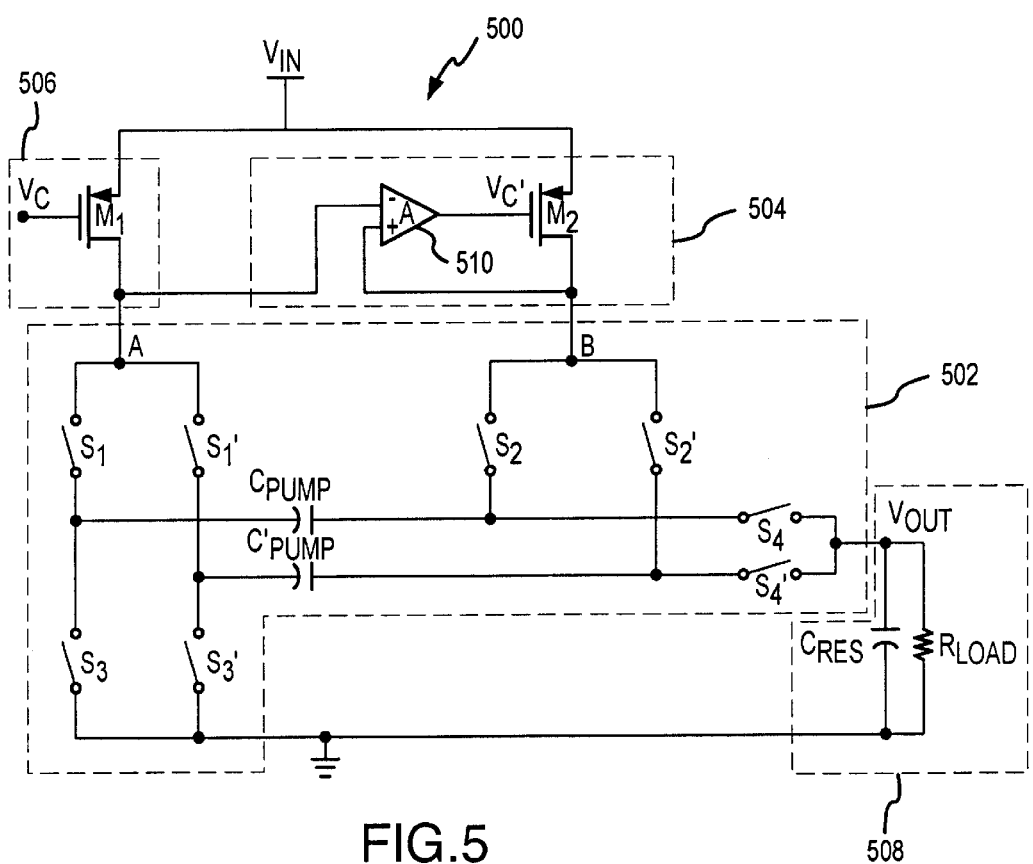
FIG. 5 illustrates a schematic diagram of an exemplary charge pump circuit in accordance with another exemplary embodiment of the present invention.

In accordance with another exemplary embodiment, with reference to FIG. 5, a charge pump circuit 500 configured for dual phase regulation suitably comprises charge pump control circuit 502, an input current controlling circuit 504, an output current control circuit 506, and an output load circuit 508. Charge pump control circuit 502 suitably comprises four switches $S_1$, $S_2$, $S_3$ and $S_4$ and a first pump capacitor $C_{PUMP}$ configured for supplying current to a load device during a first phase, and four switches $S_1'$, $S_2'$, $S_3'$ and $S_4'$ and a second pump capacitor $C_{PUMP'}$ configured for supplying current to a load device during a second phase.

Input current controlling circuit 504 is configured between an input supply voltage $V_{IN}$ and charge pump control circuit 502 to control the inrush current, and thus charging current in the charge pump capacitors of charge pump control circuit 502. In accordance with this exemplary embodiment, input current controlling circuit 504 suitably comprises a transconductance amplifier 510 and a current limiting device $M_2$. Transconductance amplifier 510 is suitably configured to provide a control voltage $V_C'$ for control of the gate of current limiting device $M_2$. Transconductance amplifier 510 suitably comprises any transconductance stage. In the exemplary embodiment, transconductance amplifier 510 comprises a high output impedance. Transconductance amplifier 510 comprises a negative terminal coupled to node A, i.e., to the drain of pass device $M_1$, and a positive terminal configured in a feedback loop with the drain of current limiting device $M_2$ at node B. Current limiting device $M_2$ comprises a PMOS transistor having a source coupled to input supply voltage $V_{IN}$ and a drain coupled to charge pump control circuit 402 at node B, however, can also comprise a PNP transistor configuration. In addition, current limiting device $M_2$ comprises a gate coupled to the output of transconductance stage 510 to receive control voltage $V_C'$, and is suitably configured with a large gate capacitance.

The feedback loop comprising transconductance stage 510 and current limiting device $M_2$ is configured to control the recharging current through current limiting device $M_2$ such that the average voltage at node B is approximately equal to the average voltage at node A. Accordingly, the current through current limiting device $M_2$ is approximately equal to the current through pass device $M_1$.

With respect to the operation of the feedback loop, the average voltage at node B can be regulated to other voltages in addition to approximately equal to the average voltage at node A. For example, input current controlling circuit 504 can be configured to regulate the average voltage at node B to some smaller percentage of the average voltage at node A, e.g., from less than 100% to greater than 1%, such as 20% of the average voltage at node A, or some larger percentage. In addition, rather than regulating the average voltage at node B to some percentage of the average voltage at node A, input current controlling circuit 504 can be configured to regulate the average voltage at node B to some other reference voltage provided to the negative input terminal of transconductance stage 510. Accordingly, the average voltage at node B can be regulated to any voltage such that the peak recharging currents for first pump capacitor $C_{PUMP}$ and a second pump capacitor $C_{PUMP'}$ are controlled.

In the exemplary embodiment, due to the high output impedance of transconductance stage 510 and the large gate capacitance of current limiting device $M_2$, the feedback loop is configured to have a slow response at the switching frequency. As a result, control voltage $V_C'$ at the output of transconductance stage 510 comprises a filtered differential voltage between nodes A and B having minimal variance, i.e., control voltage $V_C'$ does not exactly follow control voltage $V_C$, but instead is slightly dampened. Stated another way, the variation of control voltage $V_C'$ is relatively small during each switching cycle, thus resulting in a small variation of current flowing through current limiting device $M_2$ during each switching cycle.

In addition, input current controlling circuit 504 can be readily configured with overlapping clock schemes, e.g., with a portion of discharging cycles of first pump capacitor $C_{PUMP}$ and a second pump capacitor $C_{PUMP'}$ occurring simultaneously. The overlapping clock scheme that can be implemented can include that disclosed more fully in U.S. application Ser. No. 10/101,050, filed Mar. 18, 2002, entitled "CHARGE PUMP HAVING VERY LOW VOLTAGE RIPPLE", having a common inventor and assignee as the present application. Further, operation of input current controlling circuit 504 is independent of the transistor sizes of pass device $M_1$ and current limiting device $M_2$.

Accordingly, through use of input current controlling circuit 504, the peak recharging currents for first pump capacitor $C_{PUMP}$ and a second pump capacitor $C_{PUMP'}$ are significantly reduced. Moreover, since the instantaneous currents through pass device $M_1$ and current limiting device $M_2$ are controlled, the total input current, as well as the ground current, is controlled at all times. Thus, the noise and EMI problems generated by excessive inrush current are significantly reduced and/or eliminated.

The present invention has been described above with reference to an exemplary embodiment. However, those skilled in the art will recognize that changes and modifications may be made to the exemplary embodiment without departing from the scope of the present invention. For example, the various components may be implemented in alternate ways, such as, for example, the changing of transistor devices from PMOS to NMOS transistors and the changing of the polarity of the charge pump circuits. In addition, various of the transistor devices can be suitably configured as bipolar devices, such as, for example, the pass devices being configured as a PNP bipolar device. Moreover, the charge pump circuit with an input controlling circuit can be suitably configured with single phase charge pumps, as well as dual phase charge pumps. These alternatives can be suitably selected depending upon the particular application or in consideration of any number of factors associated with the operation of the system. In addition, the techniques described herein may be extended or modified for use with other integrated circuits separate from a charge pump circuit. These and other changes or modifications are intended to be included within the scope of the present invention, as expressed in the following claims.

What is claimed is:

1. A charge pump circuit configured for providing a regulated output voltage, said charge pump circuit comprising:

a supply input terminal for receiving a supply voltage;

a charge pump control circuit configured for regulation of said output voltage;

an output load circuit comprising a reservoir capacitor and a load device, said output load circuit configured for maintaining a voltage charge on said load device;

an output current controlling circuit coupled between said input terminal and said charge pump control circuit at a first node, said output current controlling circuit configured for controlling output current to facilitate regulation of said output voltage, and an input current controlling circuit coupled between said input terminal and said charge pump control circuit at a second node, said input current controlling circuit configured for controlling inrush current received from said input terminal by regulating an average voltage at said second node to correspond to an average voltage at said first node.

2. The charge pump circuit according to claim 1, wherein said input current controlling circuit comprises a current limiting device coupled between said input terminal and said charge pump control circuit.

3. The charge pump circuit according to claim 2, wherein said output current controlling circuit comprises a pass device coupled between said input terminal and said charge pump control circuit, said pass device having an input terminal coupled to said input terminal, an output terminal coupled to said first node, and a control terminal configured to receive a first control voltage signal.

4. The charge pump circuit according to claim 3, wherein said current limiting device comprises a transistor having an input terminal coupled to said supply input terminal, an output terminal coupled to said second node, and a control terminal coupled to said control terminal of said pass device to receive said first control voltage signal.

5. The charge pump circuit according to claim 4, wherein said charge pump circuit operates with a non-overlapping clock scheme.

6. The charge pump circuit according to claim 3, wherein said input current controlling circuit further comprises a transconductance amplifier coupled between said pass device and said current limiting device, said transconductance amplifier configured for providing a second control voltage signal to said current limiting device.

7. The charge pump circuit according to claim 6, wherein said current limiting device comprises a transistor having an input terminal coupled to said supply input terminal, an output terminal coupled to said second node, and a control terminal coupled to an output of said transconductance amplifier for receiving said second control voltage signal.

8. The charge pump circuit according to claim 7, wherein said transconductance amplifier and said current limiting device are configured in a feedback loop configured for controlling inrush current flowing through said current limiting device.

9. The charge pump circuit according to claim 8, wherein said transconductance amplifier and said current limiting device are configured in said feedback loop such that said average voltage at said second node is approximately equal to said average voltage at said first node.

10. The charge pump circuit according to claim 8, wherein said transconductance amplifier and said current limiting device are configured in said feedback loop such that said average voltage at said second node is a smaller percentage to that of said average voltage at said first node.

11. The charge pump circuit according to claim 8, wherein said transconductance amplifier comprises a negative terminal coupled to said first node and a positive terminal coupled to said second node to facilitate operation of said feedback loop.

12. The charge pump circuit according to claim 8, wherein said transconductance amplifier comprises a high output impedance and said current limiting device comprises a large gate capacitance such that said feedback loop has a slower response at a given switching frequency of said charge pump control circuit to facilitate a reduced variation of current flowing through said current limiting device during operation of said charge pump control circuit.

13. The charge pump circuit according to claim 6, wherein said charge pump circuit operates with an overlapping clock scheme.

14. A charge pump circuit configured for dual phase voltage regulation, said charge pump circuit comprising:
   an input supply voltage terminal;
   a dual phase charge pump control circuit comprising a first charge pump capacitor and a second charge pump capacitor;
   an output load circuit coupled to said charge pump control circuit, said output load circuit comprising a reservoir capacitor and a load device, said reservoir capacitor coupled in parallel to said load device;
   a pass device coupled between said input supply voltage terminal and said charge pump control circuit, said pass device having a control terminal configured for receiving a first control signal for facilitating control of discharging current flowing through said first charge pump capacitor and said second charge pump capacitor; and
   an input current control circuit comprising a current limiting device coupled between said input supply voltage terminal and said charge pump control circuit, said input current control circuit configured for controlling charging current flowing through said first charge pump capacitor and said second charge pump capacitor.

15. The charge pump circuit according to claim 14, wherein said pass device is coupled to said charge pump control circuit at a first node, said current limiting device is coupled to said charge pump control circuit at a second node.

16. The charge pump circuit according to claim 14, wherein said input current control circuit is configured for regulating an average voltage at said second node to be approximately equal to an average voltage at said first node.

17. The charge pump circuit according to claim 14, wherein said input current control circuit is configured for regulating an average voltage at said second node to be a smaller percentage corresponding to an average voltage at said first node.

18. The charge pump circuit according to claim 14, wherein said current limiting device comprises an output terminal coupled to said second node, and a control terminal coupled to said control terminal of said pass device to receive said first control voltage signal.

19. The charge pump circuit according to claim 14, wherein said input current control circuit further comprises a transconductance amplifier coupled between said pass device and said current limiting device, said transconductance amplifier configured for providing a second control voltage signal to a control terminal of said current limiting device.

20. The charge pump circuit according to claim 19, wherein said transconductance amplifier comprises a negative terminal coupled to said first node and a positive terminal coupled to said second node.

21. The charge pump circuit according to claim 19, wherein said transconductance amplifier and said current limiting device are configured in a feedback loop configured for controlling inrush current flowing through said current limiting device.

22. The charge pump circuit according to claim 21, wherein said transconductance amplifier comprises a high output impedance and said current limiting device comprises a large gate capacitance such that said feedback loop facilitates a reduced variation of current flowing through said current limiting device during operation of said charge pump control circuit.

23. A voltage regulator circuit for providing dual phase voltage regulation, said voltage regulator comprising:
   a dual phase charge pump control circuit comprising a first charge pump capacitor and a second charge pump capacitor;
   an output load circuit coupled to said dual phase charge pump control circuit, said output load circuit comprising a reservoir capacitor, a load device and a feedback resistor network, said reservoir capacitor coupled in parallel to said load device;
   a pass device coupled to said dual phase charge pump control circuit, said pass device having a control terminal configured for receiving a first control signal for facilitating control of discharging current flowing through said first charge pump capacitor and said second charge pump capacitor;
   an error amplifier having an output terminal coupled to said control terminal of said pass device, a positive input terminal coupled to said resistor feedback network, and a negative terminal configured to receive a reference voltage signal; and
   an input current control circuit coupled between said input supply voltage terminal and said charge pump control circuit and configured for controlling charging current flowing through said first charge pump capacitor and said second charge pump capacitor, said input current control circuit comprising a transconductance device and a current limiting device.

24. The voltage regulator circuit according to claim 23, wherein said pass device is coupled to said charge pump control circuit at a first node, said current limiting device is coupled to said charge pump control circuit at a second node, and said input current control circuit is configured for regulating an average voltage at said second node to correspond to an average voltage at said first node.

25. An electronic device comprising a charge pump circuit configured for providing a regulated output voltage, said charge pump circuit comprising:
   a charge pump control circuit configured for regulation of said output voltage;
   an output load circuit comprising a reservoir capacitor and a load device;
   an output current controlling circuit coupled to said charge pump control circuit at a first node, said output current controlling circuit configured for controlling output current to facilitate regulation of said output voltage, and
   an input current controlling circuit coupled between said input terminal and said charge pump control circuit at a second node, said input current controlling circuit configured for controlling inrush current received from said input terminal by regulating an average voltage at said second node to correspond to an average voltage at said first node.

* * * * *